United States Patent
Chang et al.

(10) Patent No.: US 11,705,172 B2
(45) Date of Patent: Jul. 18, 2023

(54) MEMORY DEVICE, MEMORY SYSTEM INCLUDING THE SAME AND OPERATING METHOD THEREOF

(71) Applicant: Samsung Electronics Co., Ltd., Suwon-si (KR)

(72) Inventors: Hojun Chang, Seoul (KR); Hundae Choi, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 12 days.

(21) Appl. No.: 17/567,306

(22) Filed: Jan. 3, 2022

(65) Prior Publication Data
US 2022/0392503 A1    Dec. 8, 2022

(30) Foreign Application Priority Data
Jun. 8, 2021    (KR) .................. 10-2021-0074166

(51) Int. Cl.
*G11C 7/22*      (2006.01)
*G11C 7/10*      (2006.01)
*G11C 8/18*      (2006.01)
*G11C 29/02*     (2006.01)

(52) U.S. Cl.
CPC ............ *G11C 7/222* (2013.01); *G11C 7/1066* (2013.01); *G11C 7/1093* (2013.01); *G11C 8/18* (2013.01); *G11C 29/023* (2013.01)

(58) Field of Classification Search
CPC ..................................................... G11C 7/22
USPC ..................................................... 365/233.1
See application file for complete search history.

(56) References Cited

U.S. PATENT DOCUMENTS

| | | | |
|---|---|---|---|
| 7,161,397 B2 | 1/2007 | Lee et al. | |
| 7,671,647 B2 | 3/2010 | Gomm et al. | |
| 8,181,056 B2 | 5/2012 | Oh | |
| 8,300,482 B2 * | 10/2012 | Bae ..................... | G11C 7/1093 365/230.01 |
| 8,339,167 B2 | 12/2012 | Gomm et al. | |
| 9,818,471 B1 | 11/2017 | Oh et al. | |
| 9,864,720 B2 | 1/2018 | Chae et al. | |
| 10,430,092 B1 * | 10/2019 | Wu ....................... | G11C 11/005 |
| 10,529,398 B1 | 1/2020 | Lee et al. | |
| 10,923,175 B2 | 2/2021 | Moon et al. | |
| 2010/0165758 A1 * | 7/2010 | Park ..................... | G11C 29/028 365/194 |
| 2012/0087194 A1 * | 4/2012 | Oh ........................ | G11C 7/1093 365/189.16 |

(Continued)

FOREIGN PATENT DOCUMENTS

KR    10-2019-0093102 A    8/2019

OTHER PUBLICATIONS

US 10,748,586 B2, 08/2020, Kim (withdrawn)

*Primary Examiner* — Muna A Techane
(74) *Attorney, Agent, or Firm* — Harness, Dickey & Pierce, P.L.C.

(57) ABSTRACT

A method of operating a memory device includes receiving a duty training request, performing first training for a write path in a first period, storing a result value of the first training, performing second training for a write path in a second period, storing a result value of the second training, transmitting the result value of the first training to an external device, and receiving a duty cycle adjuster (DCA) code value corresponding to the first training result value from the external device.

20 Claims, 11 Drawing Sheets

(56) References Cited

U.S. PATENT DOCUMENTS

| | | | |
|---|---|---|---|
| 2014/0355359 A1* | 12/2014 | Linam | G11C 7/22 |
| | | | 365/189.02 |
| 2018/0090186 A1* | 3/2018 | Kang | H03L 7/091 |
| 2019/0237127 A1 | 8/2019 | Moon et al. | |
| 2020/0336137 A1 | 10/2020 | Gans | |
| 2021/0287724 A1* | 9/2021 | Gans | G11C 7/1045 |

* cited by examiner

MEMORY DEVICE, MEMORY SYSTEM INCLUDING THE SAME AND OPERATING METHOD THEREOF

CROSS-REFERENCE TO RELATED APPLICATION(S)

This application claims benefit of priority to Korean Patent Application No. 10-2021-0074166 filed on Jun. 8, 2021 in the Korean Intellectual Property Office, the disclosure of which is incorporated herein by reference in its entirety.

BACKGROUND

The present inventive concepts relate to a memory device, a memory system including the same, and an operating method thereof.

Mobile-oriented semiconductor memory devices such as low power double data rate (LPDDR) dynamic random access memories (DRAM) have been mainly used in mobile electronic devices. When an application processor (AP) is mounted in a mobile electronic device as one of multiple cores, a semiconductor memory device such as an LPDDR DRAM may be used as a working memory of the AP.

SUMMARY

An aspect of the present inventive concepts is to provide a novel memory device for compensating for a duty error, a memory system including the same, and an operating method thereof.

According to an aspect of the present inventive concepts, a memory device includes: a first register storing a first code value; a second register storing a second code value; a third register storing first training information; a duty cycle adjuster selecting one of the first code value and the second code value according to operation mode information and adjusting a duty of a data transmission clock according to the selected code value; and a duty cycle monitor performing first training on a write path according to a training request from an external device and performing second training on a read path, wherein the first code value is transmitted from an external device, the second code value corresponds to a result value of the second training, and the first training information includes a result value of the first training.

According to another aspect of the present inventive concepts, a method of operating a memory device including receiving a duty training request; performing first training for a write path in a first period; storing a result value of the first training; performing second training for a read path in a second period; storing a result value of the second training; transmitting the result value of the first training to an external device; and receiving a duty cycle adjuster (DCA) code value corresponding to the result value of the first training from the external device.

According to another aspect of the present inventive concepts, a memory system includes: a memory device; and a memory controller configured to control the memory device, wherein the memory device is configured to receive a duty training request of the memory device, perform first training for a write path in response to the duty training request, perform second training for a read path, transmit a result value of the first training to the memory controller, and receive a first code value corresponding to the result value of the first training from the memory controller.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, the contents of the present inventive concepts will be described clearly and in detail using the drawings to the extent that those of ordinary skill in the art may easily carry out the present inventive concepts.

Figure 1:
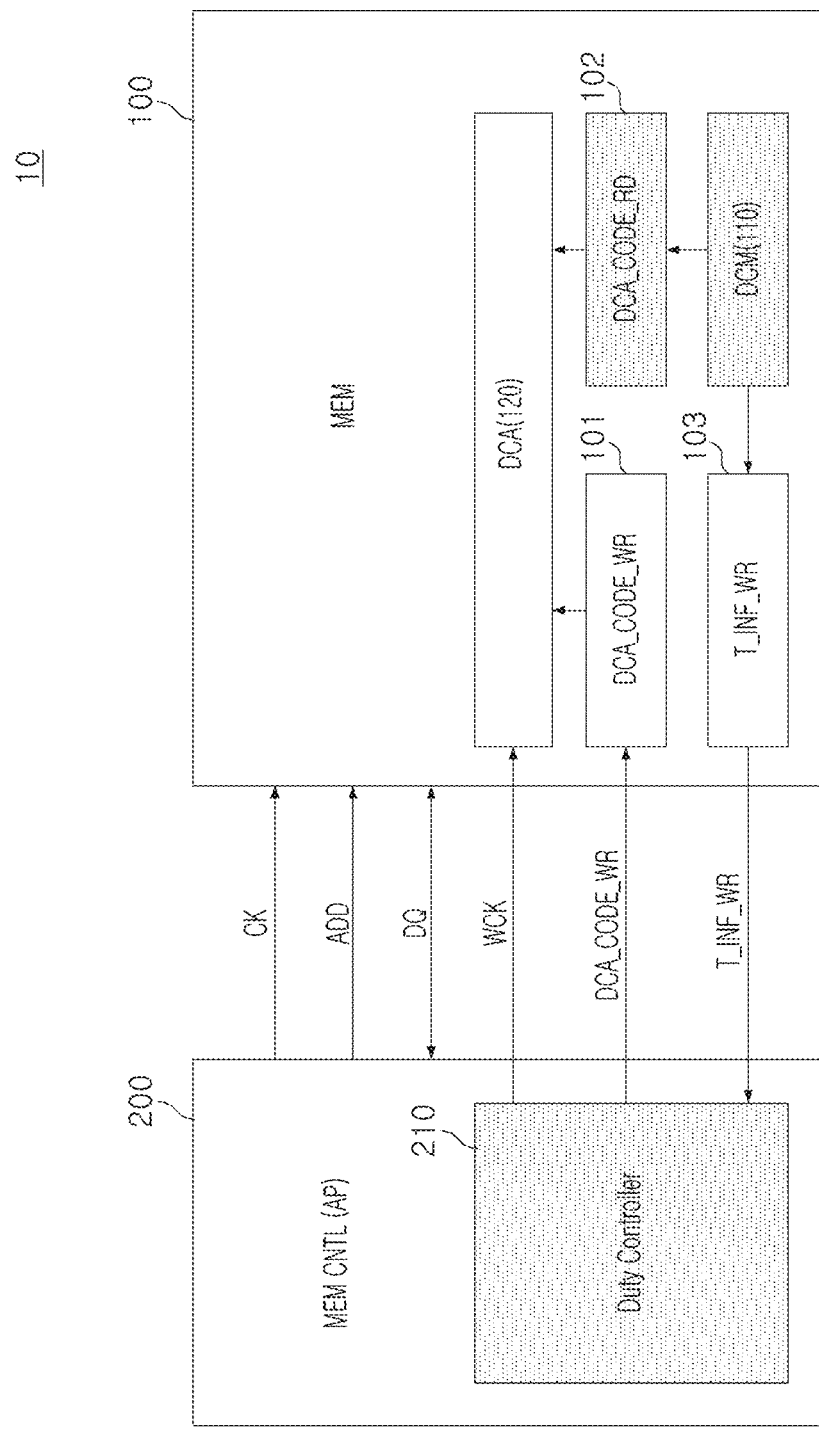
FIG. 1 is a view illustrating a memory system according to example embodiments of the inventive concepts.

FIG. 1 is a diagram illustrating a memory system according to example embodiments of the inventive concepts. Referring to FIG. 1, a memory system 10 may include a memory device 100 and/or a memory controller 200.

The memory system 10 may be implemented to be included in a personal computer (PC) or a mobile electronic device. Mobile electronic devices may be implemented as laptop computers, mobile phones, smartphones, tablet PCs, personal digital assistants (PDAs), enterprise digital assistants (EDAs), digital still cameras, digital video cameras, portable multimedia players (PMPs), personal navigation devices or portable navigation devices (PNDs), handheld game consoles, mobile Internet devices (MIDs), wearable computers, Internet of things (IoT) devices, Internet of everything (IoE) devices, or drones.

The memory device 100 may be implemented as a volatile memory device. The volatile memory device may be implemented as a random access memory (RAM), a dynamic RAM (DRAM), a static RAM (SRAM), or a low power double data rate (LPDDR) DRAM. Volatile memory devices lose their stored data when power is stopped. In contrast, a non-volatile memory device such as a magnetic random access memory (MRAM) may retain stored data even after power supply is stopped. Accordingly, when loss of data is not desired due to power failure or power cutoff, a nonvolatile memory device may be preferably used. For example, when a spin transfer torque MRAM (STT-MRAM) constitutes a memory, the non-volatile advantage of the MRAM may be added to the advantage of a fast response time of the DRAM. In example embodiments, the memory device 100 may be implemented as a non-volatile memory device. For example, the memory device 100 may include an electrically erasable programmable read-only memory (EEPROM), a flash memory, an MRAM, STT-MRAM, a ferroelectric RAM (FeRAM), a phase change RAM (PRAM), a resistive memory, a nanotube RRAM, a polymer RAM (PoRAM), a nano-floating gate memory (NFGM), a holographic memory, a molecular electronic memory device, or an insulator resistance change memory.

The memory device 100 may include first, second, and third registers 101, 102, and 103, and a duty cycle monitor (DCM) 110, and/or a duty cycle adjuster (DCA) 120.

The first register 101 may store a write mode DCA code value (DCA_CODE_WR, a first code value) transmitted from the controller 200. In some example embodiments, the write mode DCA code value DCA_CODE_WR is a value determined by the first DCA training. In example embodiments, the first DCA training may be performed in an initialization operation according to a DCA training request of the memory controller 200 for a write path or may be performed in real time according to a request of the memory controller 200.

The second register 102 may store a read mode DCA code value (DCA_CODE_RD, a second code value). In some example embodiments, the read mode DCA code value DCA_CODE_RD is a value determined by second DCA training In example embodiments, the second DCA training may be internally performed by the memory device 100 in response to a DCA training request from the memory controller 200 for a read path.

The third register 103 may store a result value of the first training according to the DCA training request of the memory controller 200.

The DCA 120 may be implemented to improve or optimize a duty using a DCA code value. For example, the DCA 120 may adjust a duty of a data transmission clock WCK according to a first code value DCA_CODE_WR stored in the first register 101 in the write mode. In addition, the DCA 120 may adjust the duty of the data transmission clock WCK according to the second code value DCA_CODE_RD stored in the second register 102 in the read mode.

The duty cycle monitor (DCM) 110 may be implemented to monitor the duty of a clock, for example, the data transmission clock WCK. For example, the DCM 110 may monitor the duty of the data transmission clock WCK passing through the write path in the first DCA training period. Also, the DCM 110 may monitor the duty of the data transmission clock WCK passing through the read path in the second DCA training period.

The memory controller 200 may be implemented as an integrated circuit, a system on chip (SoC), an application processor (AP), a mobile AP, a chipset, or a set of chips. The memory controller 200 may include a random access memory (RAM), a central processing unit (CPU), a graphics processing unit (GPU), a neural network processing unit (NPU), or a modem. In example embodiments, the memory controller 200 may perform a function of a modem and a function of an AP.

The memory controller 200 may be implemented to control the memory device 100 to read data stored in the memory device 100 or write data to the memory device 100. The memory controller 200 may control a write operation or a read operation with respect to the memory device 100 by providing a command CMD and an address ADD to the memory device 100 in synchronization with a clock CK. Also, data DQ may be transmitted/received between the memory controller 200 and the memory device 100 in synchronization with the data transmission clock WCK.

The memory controller 200 may include a duty controller 210 that controls the duty of the memory device 100. The duty controller 210 may transmit the data transmission clock WCK to the memory device 100, receive training information T_INF related to DCA training from the memory device 100, and output write mode DCA code value (DCA_CODE_WR) corresponding to the training information T_INF.

The memory device 100 may store duty error information (e.g., DCA_CODE_WR) for a write mode and duty error information (e.g., DCA_CODE_RD) for a read mode during DCA-DCM training in two different registers 101 and 102 and may selectively apply the information in a write operation/read operation.

In general, a high-speed DRAM such as LPDDR5/DDR5 shows a reduction in data output valid eye due to duty cycle distortion of an external block and internal duty cycle distortion based on process, voltage, and/or temperature distribution. The LPDDR5 performs duty cycle correction by detecting a 4-phase clock used by a data detection amplifier during the DCA-DCM training period. In some example embodiments, a tDSH margin in the write operation is improved or optimized. However, since the write path and the read path are separated, the DCA-DCM training result has difficulties in correcting a read clock duty and improving or optimizing read margin characteristics.

In contrast, the memory device 100 according to example embodiments of the inventive concepts may perform improved or optimal duty compensation according to a read operation or a write operation by distinguishing clock duty information (e.g., DCA_CODE_RD) of the read operation from clock duty information (e.g., DCA_CODE_WR) of the write operation.

The memory system 10 according to example embodiments of the inventive concepts includes the memory device 100 for compensating for an improved or optimal clock duty in the read/write mode, thereby improving overall system performance.

Figure 2:
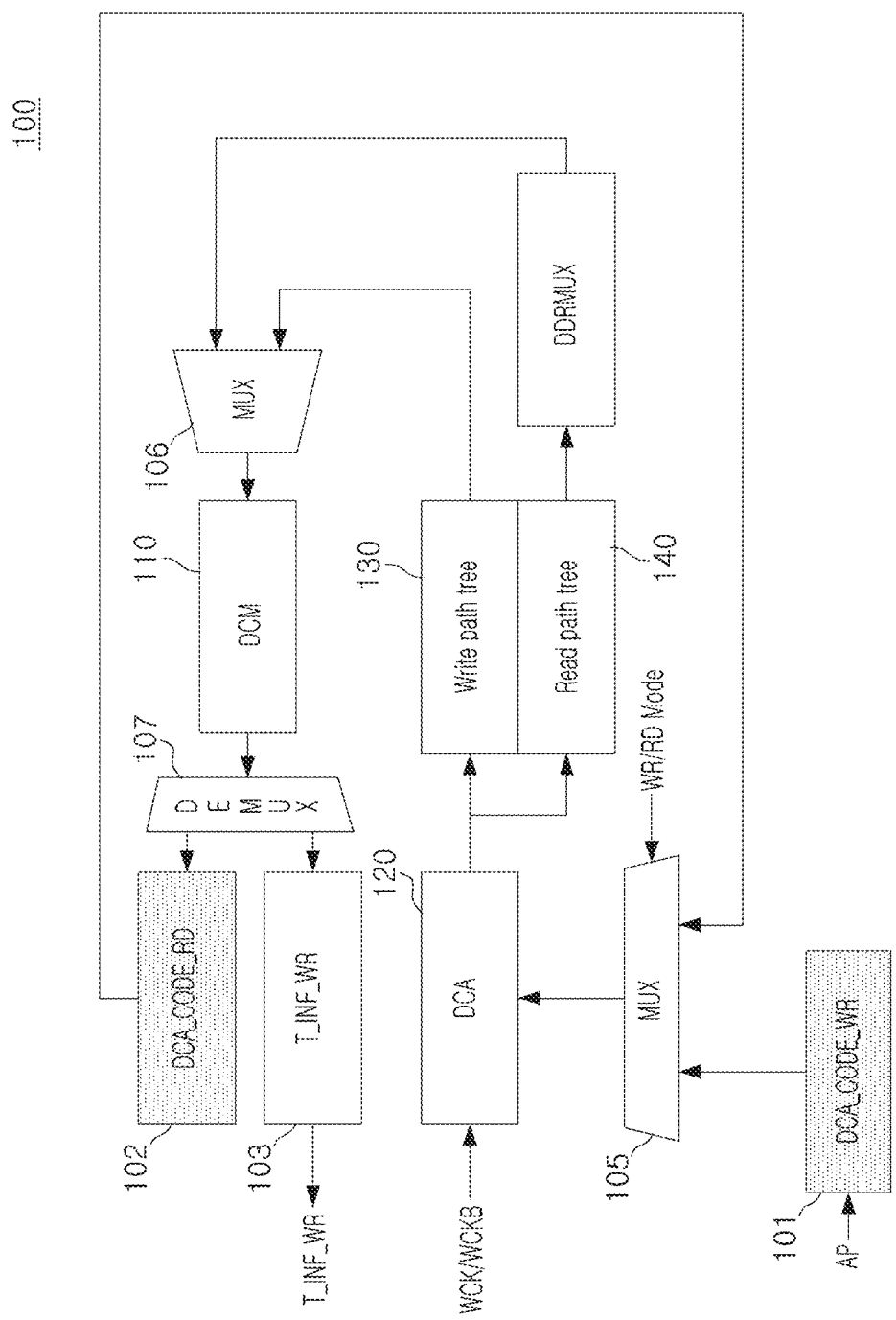
FIG. 2 is a view illustrating a memory device according to example embodiments of the inventive concepts.

FIG. 2 is a diagram illustrating a memory device 100 according to example embodiments of the inventive concepts. Referring to FIG. 2, the memory device 100 may include the registers 101, 102, and 103, a first multiplexer 105, a second multiplexer 106, a demultiplexer 107, the DCM 110, and/or the DCA 120.

The first register 101 may store the write mode DCA code DCA_CODE_WR. In some example embodiments, the write mode DCA code (DCA_CODE_WR, first code value) may be received from the controller 200 (AP) (please refer to FIG. 1).

The second register 102 may store the read mode DAC code (DCA_CODE_RD, a second code value). In some example embodiments, the read mode DCA code DCA_CODE_RD may be generated based on training for the read path 140 inside the memory device 100.

The third register 103 may store a training result value according to training for the write path 130 of the memory device 100.

The first multiplexer 105 may be implemented to select one of the first code value stored in the first register 101 and the second code value stored in the second register 102 based on the write/read mode information. For example, in the write mode, the first multiplexer 105 may select the code value stored in the first register 101 as a DCA code value. In the read mode, the first multiplexer 105 may select the code value stored in the second register 102 as the DCA code value.

The second multiplexer 106 may be implemented to select one of a clock passing through the write path 130 and a clock passing through the read path 140. For example, the second multiplexer 106 may select the clock passing through the write path 130 in a first period of the DCA training period. The second multiplexer 106 may select the clock passing through the read path 140 in a second period of the DCA training period.

The demultiplexer 107 may store the output value of the DCM 110 in the third register 103 in the first period. In addition, the demultiplexer 107 may store the output value of the DCM 110 in the second register 102 in the second period.

The memory device 100 may generate an improved or optimal DCA code value according to a write/read operation by independently performing DCA-DCM training for the write path 130 and read path 140, respectively.

Figure 3:
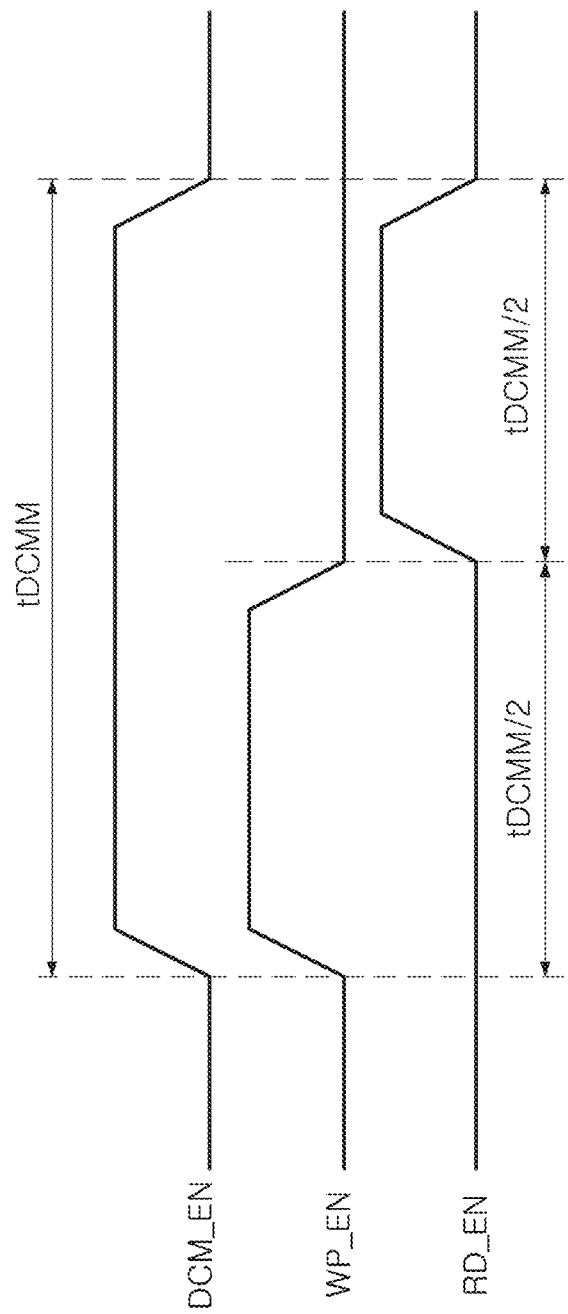
FIG. 3 is a timing diagram for DCA-DCM training performed in a memory device according to example embodiments of the inventive concepts.

FIG. 3 is a timing diagram illustrating timing for DCA-DCM training in the memory device 100 according to example embodiments of the inventive concepts.

Referring to FIG. 3, a DCA training enable signal DCA_EN may be divided into a write path training enable signal WP_EN and a read path training enable signal RD_EN. A total period tDCMM for enabling DCM training may include a first period tDCMM/2 for first training for the write path 130 and a second period tDCMM/2 for second training for the read path 140. In example embodiments, the total period tDCMM may be 2 μs. Each of the first period and the second period may be 1 μs. However, it should be understood that the present inventive concepts are not limited to these numerical values.

As shown in FIG. 3, in DCM training, the first training for the write path 130 may be performed first, and the second training for the read path 140 may then be performed. Conversely, in DCM training, training for the read path 140 may be performed first, and training for the write path 130 may then be performed.

In example embodiments, the training period tDCMM may be internally divided in half (tDCMM/2) and training may be performed with the single DCA 110 common to each of the write path 130 and the read path 140.

Figure 4A:
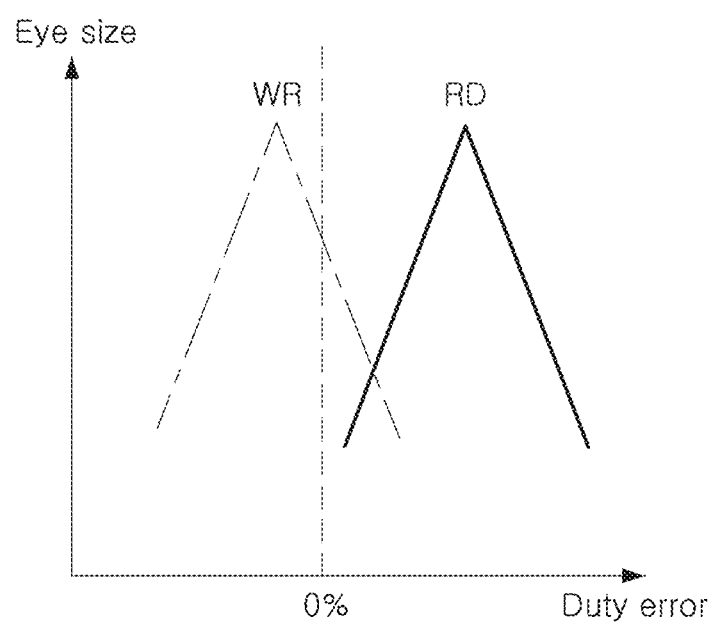
FIG. 4A is a view illustrating a duty error before DCA training.
Figure 4B:
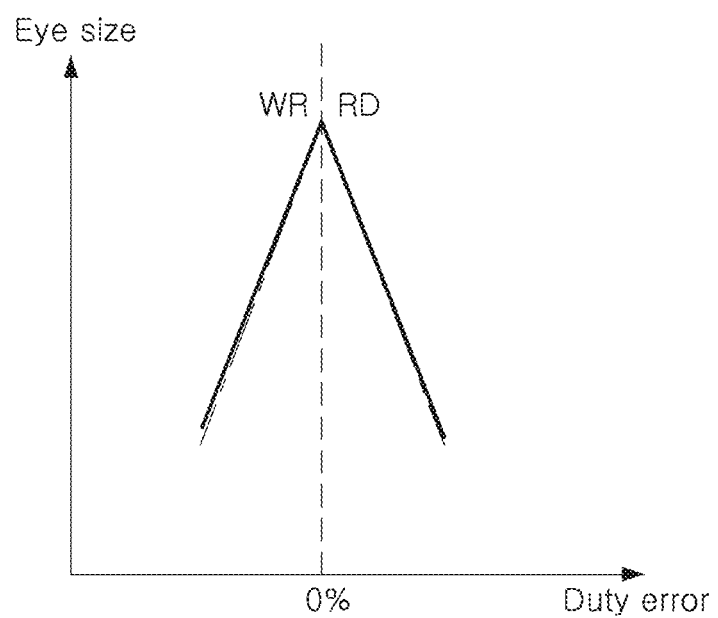
FIG. 4B is a view illustrating a duty error correction after training, according to example embodiments of the inventive concepts.

FIG. 4A is a view illustrating a duty error before DCA training, and FIG. 4B is a view illustrating a duty error correction after training according to example embodiments of the inventive concepts. As shown in FIG. 4A, a duty error exists in the write mode WR and the read mode RD before DCA training. After DCA training, the duty error is corrected to 0% in the read mode RD and the write mode WR as shown in FIG. 4B.

Figure 5:
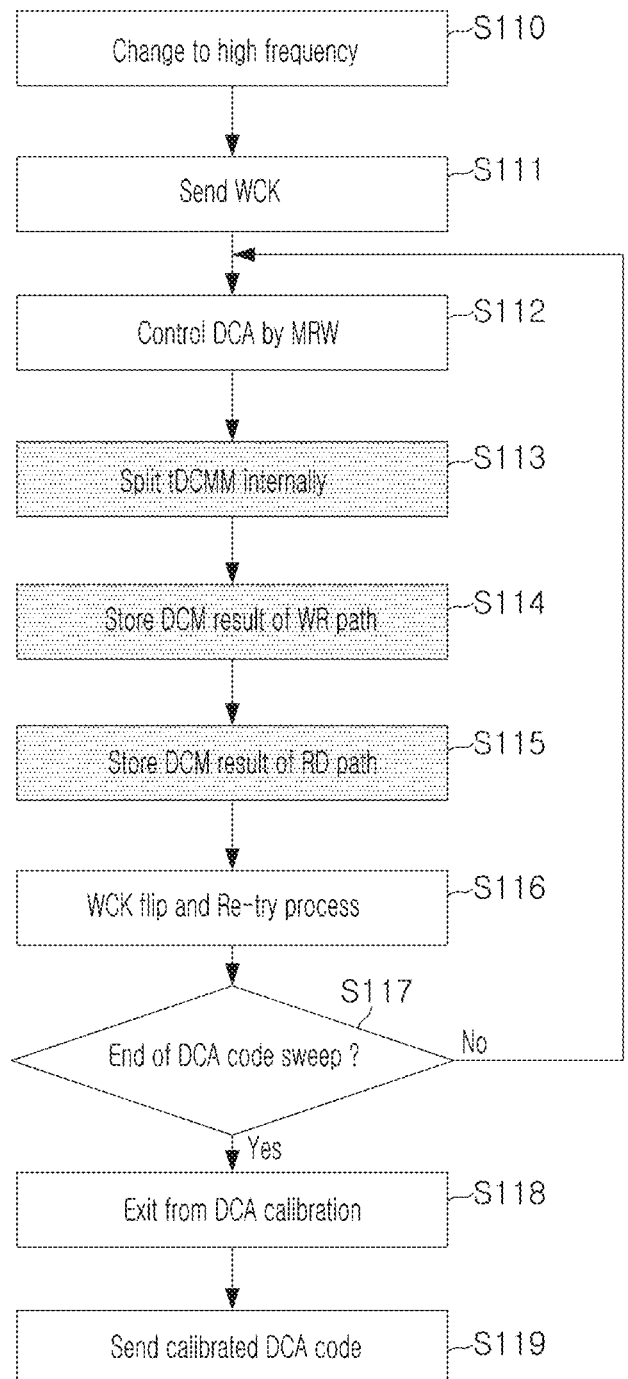
FIG. 5 is a flowchart illustrating a duty correction method according to example embodiments of the inventive concepts.

FIG. 5 is an example flowchart illustrating a duty correction method according to example embodiments of the inventive concepts. Referring to FIGS. 1 to 5, the duty correction method may be performed as follows.

The controller 200 may convert a clock to a high frequency for DCA training (S110). The controller 200 may transmit the data transmission clock WCK for DCA training to the memory device 100 (S111). The controller 200 may control the DCA by a MRW (S112).

The memory device 100 may internally divide the DCA training period tDCMM (S113). In the first training period tDCMM/2, the DCM result value for the write path 130 may be stored in the first register 101 (S114). After the first training period tDCMM/2, the DCM result value for the read path 140 in the second training period may be stored in the second register 102 (S115). The controller 200 may obtain a DCA result value for the write path 130 by checking the first register 101. Operations S113, S114, and S115 may be performed once more (S116). Thereafter, it may be determined whether the end of the DCA code has been swept (S117). If the end of the DCA code has been swept, the controller 200 may exit the DCA calibration operation (S118). Thereafter, the calibrated DCA code may be transmitted to the memory device 100 (S119). If the end of the DCA code has not been swept, operation S112 may be performed.

Figure 6:
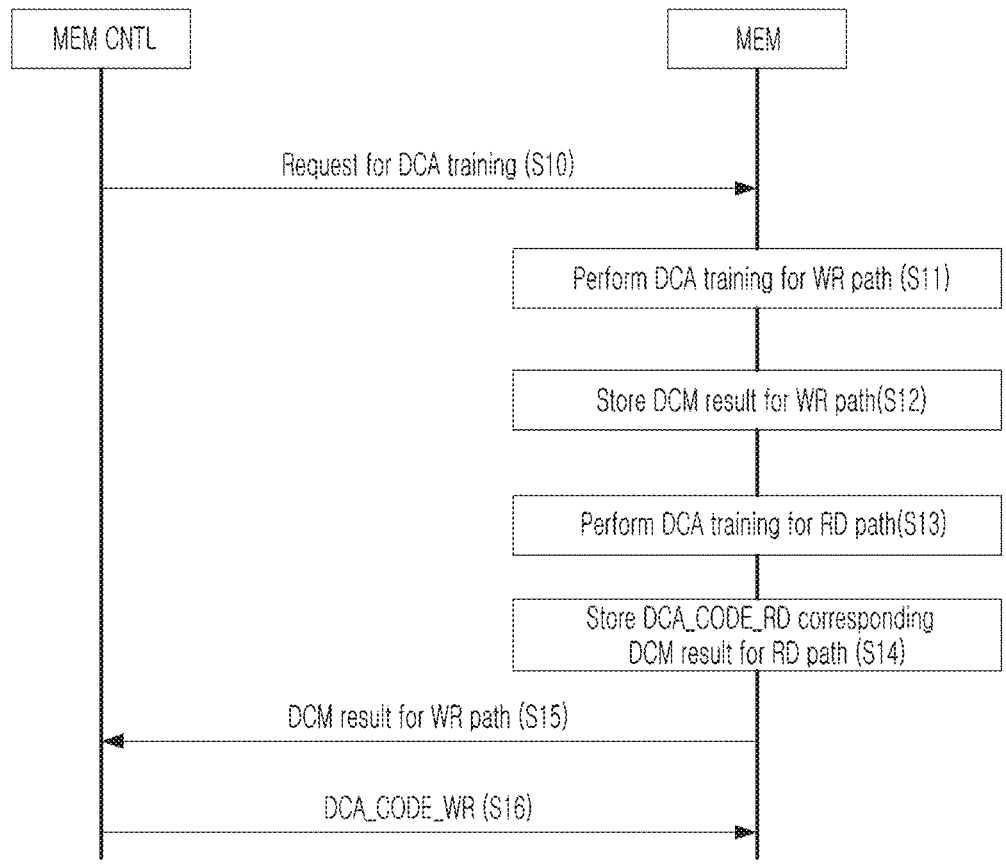
FIG. 6 is a ladder diagram illustrating DCA training of a memory system according to example embodiments of the inventive concepts.

FIG. 6 is a ladder diagram illustrating DCA training of a memory system according to example embodiments of the inventive concepts. Referring to FIGS. 1 to 6, DCA training may be performed as follows.

The controller MEM CNTL may request DCA training for duty adjustment from the memory device MEM (S10). The memory device MEM may perform DCA training in response to such a request. First, the memory device MEM may perform DCA training for the write path 130 (please refer to FIG. 2) (S11). In some example embodiments, the memory device MEM may store the DCM result value for the write path 130 in the register 101 (S12). Next, the memory device MEM may perform DCA training for the read path 140 (please refer to FIG. 2) (S13). In some example embodiments, the memory device MEM may store the read mode DCA code value DCA_CODE_RD corresponding to the DCM result value for the read path 140 in the register 102 (S14).

Thereafter, the controller MEM CNTL may read the DCM result value for the write path 130 stored in the first register 101 of the memory device MEM (S15). The controller MEM CNTL may generate a write mode DCA code value DCA_CODE_WR by using the DCM result value for the write path 130, and transmit the write mode DCA code value DCA_CODE_WR to the memory device MEM (S16).

In example embodiments, by monitoring the duty of the write path clock, it is possible to feed back to the AP and receive the write path DCA control code determined by the AP (of the controller MEM CNTL).

In example embodiments, the duty monitoring information of the read path clock is not fed back to the AP. The read path optimal DCA code may be stored in a separate internal register (on-chip hidden self-calibration).

In example embodiments, an improved or optimal DCA code stored separately in a register may be selectively used according to a DRAM write/read operation mode.

Figure 7:
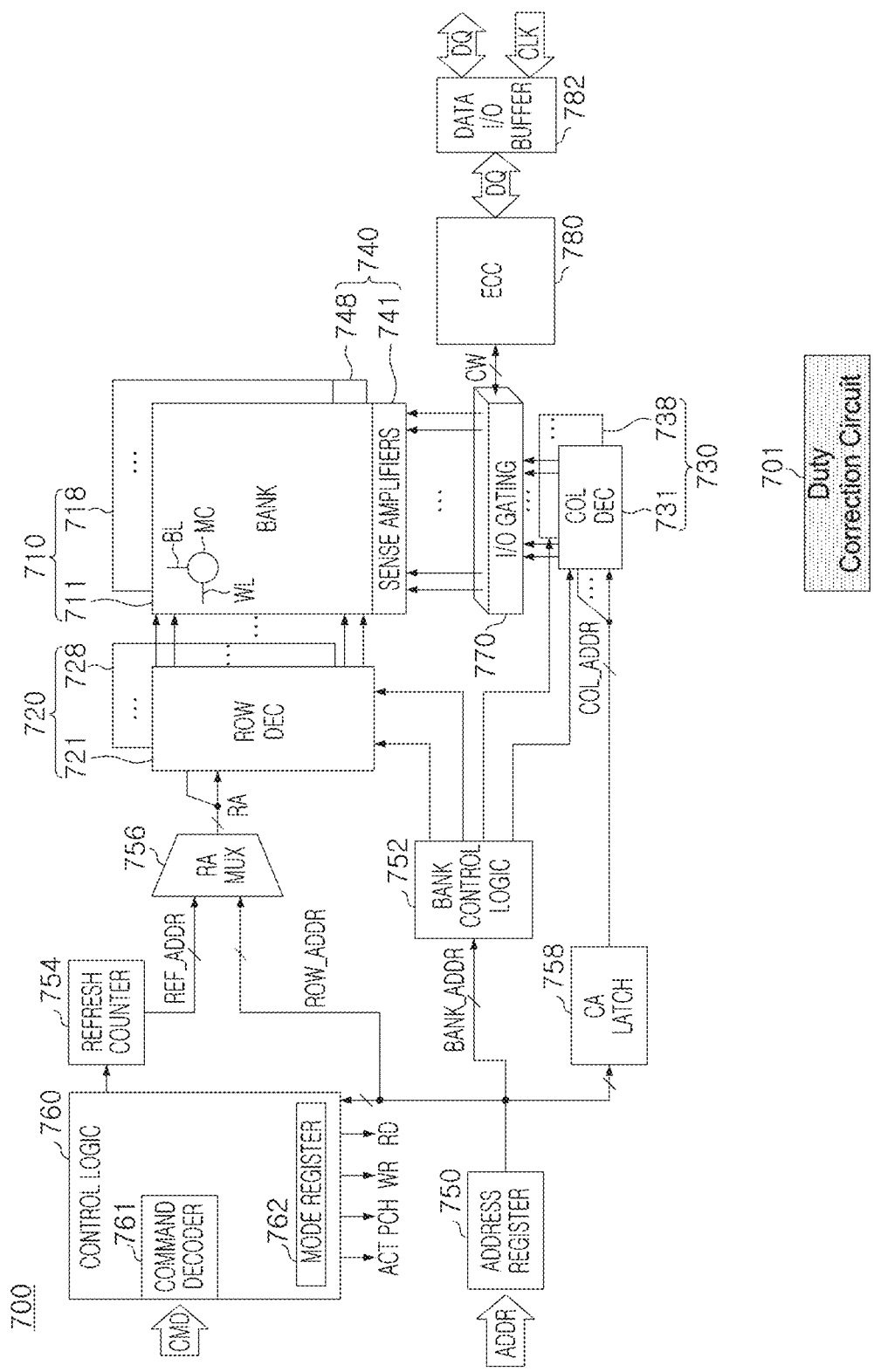
FIG. 7 is a view illustrating a memory device according to example embodiments of the inventive concepts.

FIG. 7 is a view illustrating a memory device 700 according to example embodiments of the inventive concepts. Referring to FIG. 7, the memory device 700 may include a duty correction circuit 701, a memory cell array 710, a row decoder 720, a column decoder 730, a sense amplifier circuit 740, an address register 750, a bank control logic 752, a refresh counter 754, a row address multiplexer 756, a column address latch 758, a control logic 760, a repair control circuit 766, a timing control circuit 764, an input/output (I/O) gating circuit 770, an error correction circuit (ECC) 780, and/or a data I/O buffer 782.

As described above with reference to FIGS. 1 to 6, the duty correction circuit 701 may perform first DCA training for the write path and second DCA training for the read path and store a DCA code value improved or optimal for the read/write mode.

The memory cell array 710 may include first to eighth banks 711 to 718. It should be understood that the number of banks of the memory cell array 710 is not limited thereto.

The row decoder 720 may include first to eighth bank row decoders 721 to 728 respectively connected to the first to eighth banks 711 to 718. The column decoder 730 may include first to eighth bank column decoders 731 to 738 respectively connected to the first to eighth banks 711 to 718. The sense amplifier circuit 740 may include first to eighth bank sense amplifiers 741 to 748 respectively connected to the first to eighth banks 711 to 718.

First to eighth banks 711 to 718, first to eighth bank row decoders 721 to 728, first to eighth bank column decoders 731 to 738, and first to eighth bank sense amplifiers 741 to 748 may configure the first to eighth banks, respectively. Each of the first to eighth banks 711 to 718 may include a plurality of memory cells MC formed at intersections of the word lines WL and the bit lines BL.

The address register 750 may receive an address ADDR having a bank address BANK_ADDR, a row address ROW_ADDR, and a column address COL_ADDR from an external memory controller and store the received address ADDR. The address register 750 may provide the received bank address BANK_ADDR to the bank control logic 752, the received row address ROW_ADDR to the row address multiplexer 756, and the received column address COL_ADDR to the column address latch 758.

The bank control logic 752 may generate bank control signals in response to the bank address BANK_ADDR. A bank row decoder corresponding to the bank address BANK_ADDR among the first to eighth bank row decoders 721 to 728 may be enabled in response to the bank control signals. A bank column decoder corresponding to the bank address BANK_ADDR, among the first to eighth bank column decoders 731 to 738, may be enabled in response to the bank control signals.

The row address multiplexer 756 may receive a row address ROW_ADDR from the address register 750 and receive a refresh row address REF_ADDR from the refresh counter 754. The row address multiplexer 756 may selectively output the row address ROW_ADDR or the refresh row address REF_ADDR as the row address RA. The row address RA output from the row address multiplexer 756 may be applied to each of the first to eighth bank row decoders 721 to 728.

Among the first to eighth bank row decoders 721 to 728, a bank row decoder enabled by the bank control logic 752 may decode a row address RA output from the row address multiplexer 756 to enable a word line corresponding to the row address. For example, the enabled bank row decoder may apply a word line driving voltage to the word line corresponding to the row address. Also, the enabled bank row decoder may activate a redundancy word line corresponding to a redundancy row address output from the repair control circuit 766 at the same time as activating the word line corresponding to the row address.

The column address latch 758 may receive a column address COL_ADDR from the address register 750 and temporarily store the received column address COL_ADDR. Also, the column address latch 758 may gradually increase the received column address COL_ADDR in a burst mode. The column address latch 758 may apply the temporarily stored or gradually increased column address COL_ADDR to each of the first to eighth bank column decoders 731 to 738.

The bank column decoder enabled by the bank control logic 752, among the first to eighth bank column decoders 731 to 738, may activate a sense amplifier corresponding to the bank address BANK_ADDR and the column address COL_ADDR through the I/O gating circuit 770. Also, the enabled bank column decoder may perform a column repair operation in response to a column repair signal CRP output from the repair control circuit 766.

The control logic 760 may be implemented to control the operation of the memory device 700. For example, the control logic 760 may generate control signals so that the semiconductor memory device 700 performs a write operation or a read operation. The control logic 760 may include a command decoder 761 for decoding a command CMD received from the memory controller and a mode register set 762 for setting an operation mode of the memory device 700.

For example, the command decoder 761 may decode a write enable signal /WE, a row address strobe signal /RAS, a column address strobe signal /CAS, a chip select signal /CS, and the like to generate operation control signals ACT, PCH, WE, and RD corresponding to the command CMD. The control logic 760 may provide the operation control signals ACT, PCH, WE, and RD to the timing control circuit 764. The control signals ACT, PCH, WR, and RD may include an active signal ACT, a precharge signal PCH, a write signal WR, and a read signal RD.

Each of the I/O gating circuits of the I/O gating circuit 770 may include an input data mask logic, read data latches for storing data output from the first to eighth banks 711 to 718, and write drivers for writing data into the first to eighth banks 711 to 718, together with circuits for gating I/O data.

A codeword (CW) to be read from one of the first to eighth banks 711 to 718 may be detected by a sense amplifier corresponding to one bank and may be stored in read data latches. The codeword CW stored in the read data latches may be subjected to ECC decoding by the ECC 780 and then provided to the memory controller through the data I/O buffer 782. Data DQ to be written to one of the first to eighth banks 210 to 218 may be written to one bank through write drivers after ECC encoding is performed by the ECC 780.

The data I/O buffer 782 provides the data DQ to the ECC 780 based on a clock CLK provided from the memory controller in a write operation and provide the data DQ provided from the ECC 780 to the memory controller in a read operation.

The error correction circuit ECC 780 generates parity bits based on data bits of the data DQ provided from the data I/O buffer 782 in the write operation and provides a codeword including the data DQ and the parity bits to the I/O gating circuit 770, and the I/O gating circuit 770 may write the codeword into a bank. Also, the ECC 780 may receive the codeword CW read from one bank in the read operation from the I/O gating circuit 770. The ECC 780 may perform ECC decoding on the data DQ using the parity bits included in the read codeword CW to correct at least one error bit included in the data DQ and provide the corrected error bit to the data I/O buffer 782.

The memory device 700 according to example embodiments of the inventive concepts may significantly improve data transmission/reception performance by performing improved or optimal duty correction in the read/write mode at high speeds.

Figure 8:
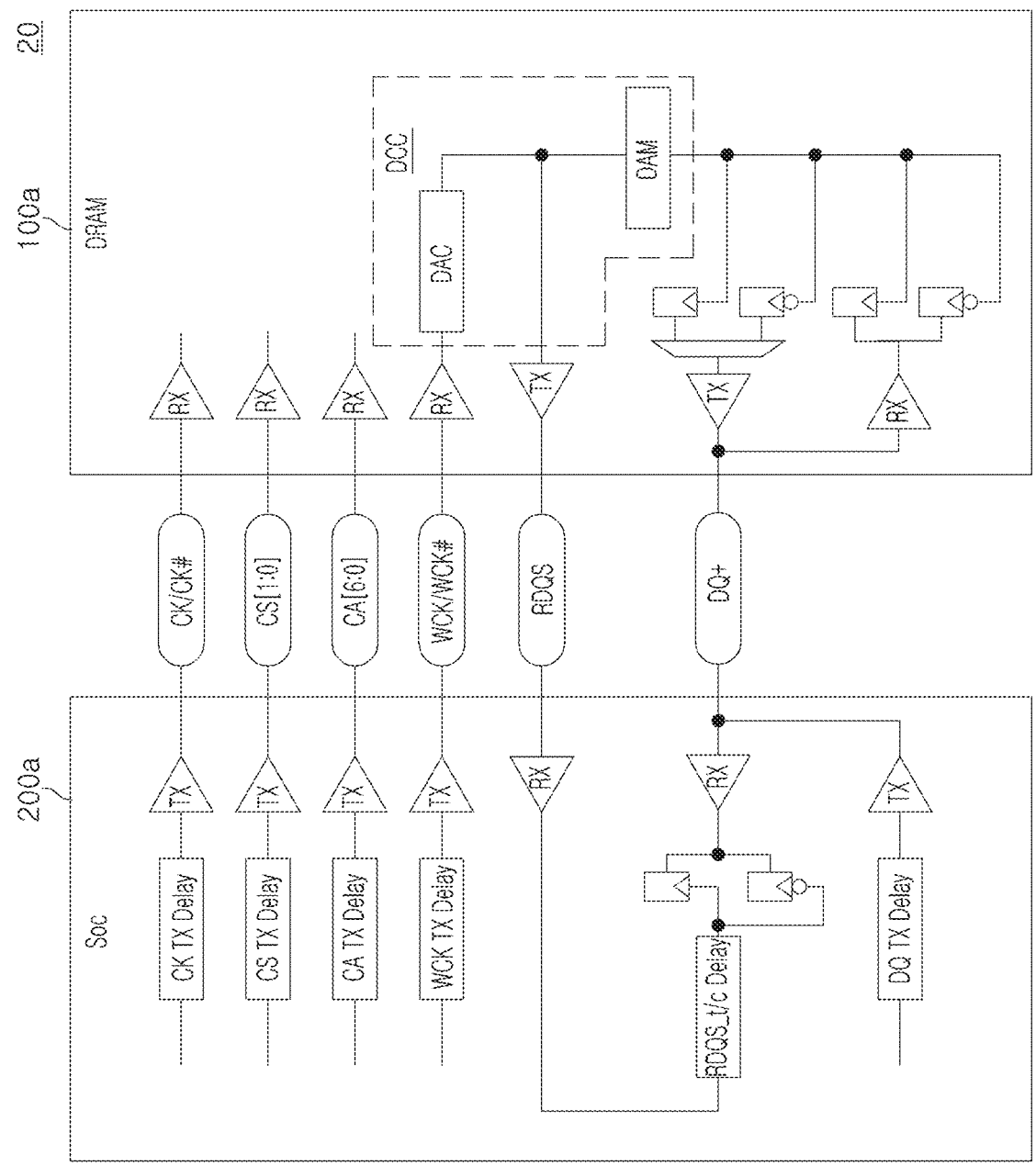
FIG. 8 is a view illustrating data transmission clock WCK training of SoC-DRAM according to example embodiments of the inventive concepts.

FIG. 8 is a view illustrating data transmission clock WCK training of SoC(System on Chip)-DRAM(Dynamic Random Access Memory) according to example embodiments of the inventive concepts. Referring to FIG. 8, a memory system 20 may include a DRAM 100a and an SoC 200a.

The SoC 200a may issue a CAS command to the DRAM 100a in synchronization with WCK2CK. The DRAM 100a may start DCM by setting a mode register MR in response to the CAS command. The DCM may perform first training on the write path during a first training period tDCMM/2 and perform second training on the read path during a second training period tDCMM/2. A result value for the first training may be stored in a write register, and a result value for the second training may be stored in a read register. The trainings described above may be repeated at least one more time. Thereafter, the training information stored in the write register may be output to the SoC 200a. At this time, the DCA may be swept. Thereafter, the SoC 200a may transmit a first DCA code value corresponding to the training information to the DRAM 100a. The DRAM 100a may compensate for the duty according to the first DCA code value in the write mode and compensate for the duty according to the second DCA code value in the read mode. In some example embodiments, the second DCA code value may correspond to training information stored in the read register.

In example embodiments, in the example of a two-rank system, the processes described above may be repeated for each rank.

Figure 9:
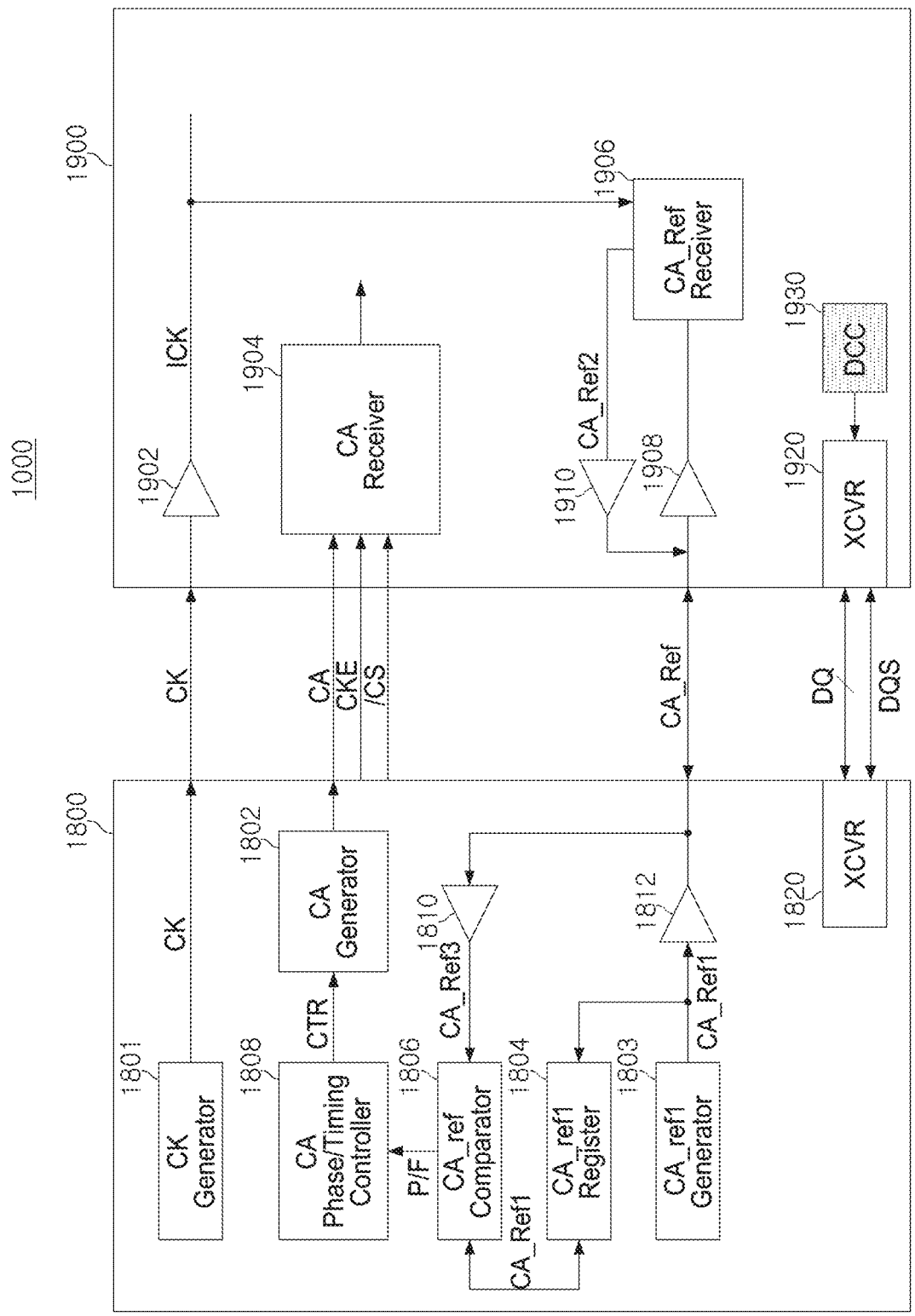
FIG. 9 is a view illustrating a memory system for performing at least one command/address calibration according to example embodiments of the inventive concepts.

FIG. 9 is a block diagram illustrating a memory system for performing at least one command/address calibration according to example embodiments of the inventive concepts. Referring to FIG. 9, a memory system 1000 may include a controller 1800 and/or a memory device 1900. The controller 1800 may include a clock generator 1801, a command/address (CA) generator 1802, a command/address reference generator 1803, a register 1804, a comparator 1806, a phase/timing controller 1808, and/or data I/O units 1810 and 1812. The controller 1800 may provide a clock CK generated by the clock generator 1801 to the memory device 1900 through a clock line.

In example embodiments, the memory system 1000 includes a separate command/address reference signal CA_Ref line in an interface. The command/address reference signal CA_Ref line may transmit/receive a command/address reference signal CA_Ref, which is a reference value of a command/address, in a calibration mode.

A phase/timing of the command/address signal CA may be adjusted by providing the calibration result value using the reference value of the command/address to the phase/timing controller 1808. Since a separate command/address reference signal CA_Ref line is provided, it is possible to perform a calibration operation that may adjust a phase/timing of the command/address CA signal, while simultaneously transmitting the command/address CA signal.

The CA generator 1802 may generate a command/address signal CA whose phase or timing is adjusted in response to a control signal CTR of the phase/timing controller 1808, and transmit the generated command/address signal CA to the memory device 1900 through a CA bus.

The command/address reference generator 1803 has the same configuration as the command/address generator 1802 and may generate the same first command/address reference signal CA_Ref1 as the command/address signal CA generated by the command/address generator 1802.

The first command/address reference signal CA_Ref1 is provided to the register 1804. Also, the first command/address reference signal CA_Ref1 is transmitted to a CA reference bus 12 through the data output unit 1812 and provided to the memory device 1900 through a CA reference bus 16.

The register 1804 may store the first command/address reference signal CA_Ref1. The comparator 1806 may compare the first command/address reference signal CA_Ref1 stored in the register 1804 with a third command/address reference signal CA_Ref3 output from the data input unit 1810. The comparator 1806 may compare data of the first command/address reference signal CA_Ref1 and the third command/address reference signal CA_Ref3 and generate a pass or fail signal P/F.

The phase/timing controller 1808 may generate a control signal CTR indicating a phase shift of the command/address signal CA according to the pass or fail signal P/F from the comparator 1806. The control signal CTR may generate a phase-adjusted command/address signal CA by adjusting a phase or timing of the command/address signal CA.

The data input unit 1810 may receive the second command/address reference signal CA_Ref2 transmitted from the memory device 1900 through the CA reference bus and deliver it as the third command/address reference signal CA_Ref3 to the comparator 1806.

The data output unit 1812 may receive the first command/address reference signal CA_Ref1 generated by the command/address reference generator 1803 and transmit the received first command/address reference signal CA_Ref to the CA reference bus 12.

The memory device 1900 may include a clock buffer 1902, a command/address (CA) receiver 1904, a command/address reference receiver 1906, and/or data I/O units 1908 and 1910. The clock buffer 1902 may receive a clock CK transmitted through a clock line and generate an internal clock ICK. The CA receiver 1904 may receive a chip select signal /CS, a clock enable signal CKE, and a command/address signal CA transmitted through a CA bus in response to the internal clock ICK.

The clock enable signal CKE may be used as a pseudo command acting as a read command of the command/address signal CA transmitted through the CA bus. The CA receiver 1904 may receive the command/address signal CA when the clock enable signal CKE is active.

The data input unit 1908 may receive the first command/address reference signal CA_Ref1 transmitted from the controller 1800 through the CA reference bus and transmit the received signal to the command/address reference receiver 1906. The command/address reference receiver 1906 may be configured in the same manner as the CA receiver 1904. The command/address reference receiver 1906 may receive the chip select signal /CS, the clock enable signal CKE, and the first command/address reference signal CA_Ref1 transmitted through the CA reference bus in response to the internal clock ICK, and generate the second command/address reference signal CA_Ref2.

The second command/address reference signal CA_Ref2 may be the same as a signal output upon receiving, by the CA receiver 1904, the chip select signal /CS, the clock enable signal CKE, and the command/address signal CA transferred through the CA bus in response to the internal clock ICK. The second command/address reference signal CA_Ref2 may be transmitted to the CA reference bus through the data output unit 1910.

CA calibration performed in the memory system 1000 is as follows. The CA generator 1802 of the controller 1800 may adjust a phase or timing of the command/address signal CA in response to the control signal CTR of the phase/timing controller 1808 and transmit the command/address signal CA to the CA bus. The command/address reference generator 1803 may generate and transmit the same first command/address reference signal CA_Ref1 as the command/address signal CA to the CA reference bus.

The CA reference receiver 1906 of the memory device 1900 may receive the first command/address reference signal CA_Ref1 according to the internal clock ICK and the clock enable signal CKE, and generate the second command/address reference signal CA_Ref2. The second command/address reference signal CA_Ref2 of the memory device 1900 may be transmitted to the CA reference bus.

The controller 1800 may transmit the second command/address reference signal CA_Ref2 transmitted through the CA reference bus, as the second command/address reference signal CA_Ref2, to the comparator 1806. The comparator 1806 may compare data of the first command/address reference signal CA_Ref1 and the second command/address reference signal CA_Ref2 and generate a pass or fail signal P/F. The phase/timing controller 1808 may generate a control signal CTR indicating a phase shift of the command/address signal CA according to the pass or fail signal P/F from the comparator 1806. The CA generator 1802 may generate a phase-adjusted command/address signal CA according to the control signal CTR.

By repeating the CA calibration operation, the phase/timing controller 1808 of the controller 1800 may determine the middle of passed (P) positions as the middle of the command/address signal CA window, generate the command/address signal CA so that the middle of the command/address signal CA window comes to an edge of the clock CK, and provide the generated command/address signal CA to the memory device 1900. Accordingly, the memory device 1900 may receive the command/address signal CA in which the middle of an effective window is located at the rising/falling edge of a clock pair CK and CKB at the rising/falling edge of the clock CK.

As shown in FIG. 9, the controller 1800 and the memory device 1900 of the memory system 1000 may include corresponding transceivers 1820 and 1920, respectively. For example, the memory device 1900 may include a duty correction circuit (DCC) 1930 receiving the data transmission clock WCK and outputting an RDQS signal. In some example embodiments, the DCC 1930 may correct a clock duty according to an improved or optimal DCA code value corresponding to the write/read operation as described above with reference to FIGS. 1 to 8.

Figure 10:
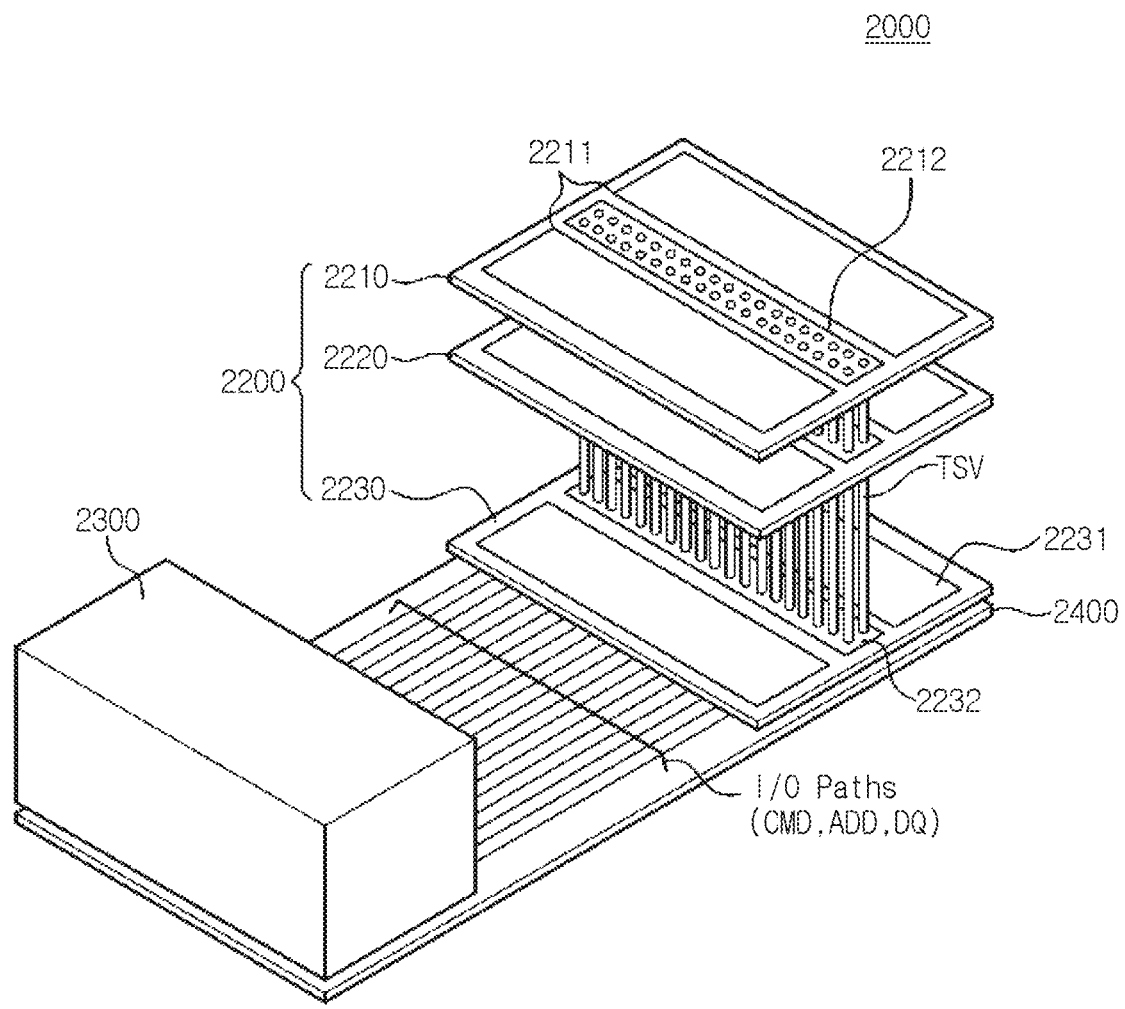
FIG. 10 is a view illustrating an electronic device 2000 according to example embodiments of the inventive concepts.

FIG. 10 is a view illustrating an electronic device 2000 according to example embodiments of the inventive concepts. Referring to FIG. 10, the electronic device 2000 may include a memory device 2200, a system-on-chip (SoC) 2300, and/or a substrate 2400.

The memory device 2200 may include memory dies 2210 and 2220 and a buffer die 2230 stacked in a vertical direction. The memory device 2200 may be a high bandwidth memory (HBM) device providing a high bandwidth. The memory device 2200 may be disposed on one surface of the substrate 2400, and solder balls or bumps may be disposed on one surface of the memory device 2200. The memory device 2200 and the substrate 2400 may be electrically connected to each other through the solder balls or bumps. The through-electrodes TSV may provide physical or electrical paths between the memory dies 2210 and 2220 and the buffer die 2230. For example, the through-electrodes TSV may be arranged in a matrix arrangement, and the arrangement position is not limited to that illustrated in FIG. 10. As described above with reference to FIGS. 1 to 9, the memory device 2200 may be implemented to perform improved or optimal clock duty correction in a read/write mode.

The memory die 2210 may include a first region 2211 and a second region 2212. In the first region 2211, components of the memory device 1200 may be disposed. In the second region 2212, through-electrodes TSV may be disposed and circuits for transmitting or receiving signals through the through-electrodes TSV may be disposed. The memory die 2220 may be implemented the same or substantially the same as the memory die 2210. The buffer die 2210 (core die or logic die) may include a first region 2231 and a second region 2232. In the first region 2231, at least one receiver for receiving commands, addresses, and data I/O signals CMD, ADD, and DQ transmitted from the SoC 2300 through I/O paths may be disposed. In addition, the components of the memory device 1200 described above may be disposed in the first region 2231. In the second region 2232, through-electrodes TSV may be disposed and circuits for transmitting or receiving signals through the through-electrodes TSV may be disposed.

The SoC 2300 may be disposed on one surface of the substrate 2400. Also, solder balls or bumps may be disposed on one surface of the SoC 2300. The SoC 2300 and the substrate 2400 may be electrically connected to each other through the solder balls or bumps. The SoC 2300 may include a memory controller 1300, components of the memory controller 1300, a processor, an on-chip memory, and the like. The SoC 2300 may include at least one receiver receiving the data I/O signal DQ transmitted from the memory device 2200 through the I/O paths.

The substrate 2400 may provide an I/O path between the SoC 2300 and the memory device 2200. For example, the substrate 2400 may be a printed circuit board, a flexible circuit board, a ceramic substrate, or an interposer. When the substrate 2400 is an interposer, the substrate 2400 may be implemented using a silicon wafer. A plurality of I/O paths may be implemented in the substrate 2400.

As set forth above, according to the memory device, the memory system including the same, and the operating method thereof according to example embodiments of the inventive concepts, duty training may be internally performed on a read path and a duty error may be compensated for in a read mode according to a result of the training.

The memory device, the memory system including the same, and the operating method thereof according to example embodiments of the inventive concepts may improve data reliability by obtaining an improved or optimal duty in each of a read mode and a write mode.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of the present inventive concepts as defined by the appended claims.

What is claimed is:

1. A memory device comprising:
   a first register configured to store a first code value;
   a second register configured to store a second code value;
   a third register storing first training information;
   a duty cycle adjuster configured to select one of the first code value and the second code value according to operation mode information and to adjust a duty of a data transmission clock according to the selected code value; and a duty cycle monitor configured to perform first training on a write path according to a training request from an external device and to perform second training on a read path, wherein the first code value is transmitted from the external device, the second code value corresponds to a result value of the second training, and the first training information includes a result value of the first training.

2. The memory device of claim 1, further comprising a first multiplexer configured to select one of the first code value stored in the first register and the second code value stored in the second register in response to the operation mode information.

3. The memory device of claim 1, further comprising a second multiplexer configured to select one of a first signal passing through the write path and a second signal passing through the read path.

4. The memory device of claim 3, wherein the second multiplexer is configured to output the first signal passing through the write path in the first training to the duty cycle monitor and is configured to output the second signal passing through the read path in the second training to the duty cycle monitor.

5. The memory device of claim 3, wherein the second training is performed after the first training is first performed.

6. The memory device of claim 3, wherein the first training is performed after the second training is first performed.

7. The memory device of claim 1, wherein the first and the second trainings are repeatedly performed at least twice according to the training request.

8. The memory device of claim 1, wherein the first code value stored in the first register is swept after the first and second trainings.

9. The memory device of claim 1, wherein the operation mode information is read mode information or write mode information.

10. The memory device of claim 1, wherein the first register is included in a mode register set.

11. A method of operating a memory device, the method comprising:
receiving a duty training request;
performing first training for a write path in a first period;
storing a result value of the first training;
performing second training for a read path in a second period;
storing a result value of the second training;
transmitting the result value of the first training to an external device; and
receiving a duty cycle adjuster (DCA) code value corresponding to the result value of the first training from the external device.

12. The method of claim 11, further comprising internally dividing a total training period into the first period and the second period in response to the duty training request.

13. The method of claim 11, wherein the receiving the duty training request includes receiving a data transmission clock.

14. The method of claim 11, wherein the first and the second trainings are repeated at least twice in response to the duty training request.

15. The method of claim 11, further comprising:
determining whether an end of the DCA code is swept,
wherein when the end of the DCA code is not swept, the first and the second trainings are repeated.

16. A memory system comprising:
a memory device; and
a memory controller configured to control the memory device,
wherein the memory device is configured to receive a duty training request from the memory device, is configured to perform first training for a write path in response to the duty training request, is configured to perform second training for a read path, is configured to transmit a result value of the first training to the memory controller, and is configured to receive a first code value corresponding to the result value of the first training from the memory controller.

17. The memory system of claim 16, wherein the duty training request is transmitted as a CAS command together with a data transmission clock.

18. The memory system of claim 16, wherein the memory controller is configured to receive the result value of the first training, is configured to generate the first code value corresponding to the result value of the first training, and is configured to transmit the first code value to the memory device.

19. The memory system of claim 18, wherein the memory device is configured to generate a second code value corresponding to a result value of the second training, and is configured to store the second code value in a register.

20. The memory system of claim 19, wherein the memory device is configured to select one of the first code value and the second code value according to read/write mode information, and is configured to correct a duty of an internal clock according to the selected code value.

* * * * *